(12) United States Patent
Okamoto et al.

(10) Patent No.: US 7,598,541 B2
(45) Date of Patent: Oct. 6, 2009

(54) SEMICONDUCTOR DEVICE COMPRISING TRANSISTOR PAIR ISOLATED BY TRENCH ISOLATION

(75) Inventors: Atsushi Okamoto, Kawasaki (JP); Toshiharu Takaramoto, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 40 days.

(21) Appl. No.: 10/920,208

(22) Filed: Aug. 18, 2004

(65) Prior Publication Data
US 2005/0189595 A1 Sep. 1, 2005

(30) Foreign Application Priority Data
Feb. 26, 2004 (JP) .............................. 2004-051832

(51) Int. Cl.
H01L 29/74 (2006.01)
H01L 29/78 (2006.01)
H01L 27/088 (2006.01)

(52) U.S. Cl. ..................... 257/205; 257/390; 257/393; 257/401

(58) Field of Classification Search ................ 257/206, 257/401, 390, 393, 205
See application file for complete search history.

(56) References Cited

U.S. PATENT DOCUMENTS

| | | | | |
|---|---|---|---|---|
| 5,481,129 A * | 1/1996 | DeJong et al. | ............... | 257/360 |
| 5,783,846 A * | 7/1998 | Baukus et al. | ............... | 257/204 |
| 5,930,163 A * | 7/1999 | Hara et al. | ................... | 365/154 |
| 5,994,755 A * | 11/1999 | DeJong et al. | ............... | 257/500 |
| 6,552,402 B1 * | 4/2003 | Ozasa et al. | ................ | 257/390 |
| 6,594,196 B2 * | 7/2003 | Hsu et al. | .............. | 365/230.05 |
| 6,635,935 B2 * | 10/2003 | Makino | ....................... | 257/369 |
| 6,833,595 B1 * | 12/2004 | Iwasaki | ...................... | 257/401 |
| 6,891,761 B2 * | 5/2005 | Kumagai et al. | ........ | 365/189.01 |
| 2003/0132473 A1 * | 7/2003 | Kumagai et al. | ............ | 257/301 |

FOREIGN PATENT DOCUMENTS

| | | |
|---|---|---|
| JP | 4-49672 A | 2/1992 |
| JP | 11-297986 | 10/1999 |
| JP | 2000-036582 A | 2/2000 |
| JP | 2000-208710 A | 7/2000 |
| JP | 2003-158205 A | 5/2003 |

OTHER PUBLICATIONS

Japanese Office Action mailed Jul. 22, 2008, issued in corresponding Japanese Application No. 2004-051832.

* cited by examiner

*Primary Examiner*—Howard Weiss
*Assistant Examiner*—Steven H Rao
(74) *Attorney, Agent, or Firm*—Westerman, Hattori, Daniels & Adrian, LLP.

(57) ABSTRACT

A semiconductor device has transistors (P1,P10,P11) formed in an active region (22) isolated by a trench isolation region, and a predetermined circuit including a first and second transistors (P10,P11) that require symmetry or relativity characteristics, wherein the distances (S1) between a gate electrode and one end of the active region on a source side viewed from the gate electrode in the first and second transistor are substantially same, and the distances (D1) between a gate electrode and one end of the active region on a drain side viewed from the gate electrode in the first and second transistor are substantially same. The predetermined circuit includes, for example, a current mirror circuit that has a transistor pair of which gate is commonly connected, and a differential circuit that has a transistor pair whose sources are commonly connected, where an input signal is supplied to the gate, and an output signal is generated in the drain.

12 Claims, 11 Drawing Sheets

PMOS Ids

NMOS Ids

FIG. 11  Example of Constructing DAC Circuit (1)

SEMICONDUCTOR DEVICE COMPRISING TRANSISTOR PAIR ISOLATED BY TRENCH ISOLATION

CROSS-REFERENCE TO RELATED APPLICATIONS

This application is based upon and claims the benefit of priority from the prior Japanese Patent Application No. 2004-51832, filed on Feb. 26, 2004, the entire contents of which are incorporated herein by reference.

BACKGROUND OF THE INVENTION

1. Field of the Invention

The present invention relates to a semiconductor device comprising a transistor pair isolated by trench isolation, and more particularly to a semiconductor device which has a layout pattern with better relative accuracy of the transistor pair in circuits for which symmetry or relativity is important.

2. Description of the Related Art

In recent semiconductor integrated circuit devices where the degree of integration is increasing, trench isolation, which can decrease the transistor size and the distance between components, is used. Trench isolation is generally called "shallow trench isolation" (STI), which is created by forming a shallow trench in the isolation area of a silicon semiconductor substrate, forming such an insulation film as a silicon oxide film on the entire surface, removing the insulation film on the surface by a chemical or mechanical polishing method, and allowing the insulation film in the trench to remain. STI is stated in Japanese Patent Application Laid-Open No. 11-297986 (FIG. 6, paragraph [0003]), for example. On the other hand, the current mirror circuit and the differential circuit in the digital analog converter (DAC) and the differential amplification circuit are circuits that include transistor pairs which require relative current characteristics. This transistor pair has a same gate width (channel width) to flow the same current, and can flow current with a predetermined ratio by setting the gate widths to be the predetermined ratio.

SUMMARY OF THE INVENTION

It is an object of the present invention to provide a semiconductor device which has a layout pattern with higher relative accuracy of the transistor pair in a circuit for which symmetry or relativity is important.

To achieve the above object, the first aspect of the present invention is a semiconductor device comprising transistors formed in an active region isolated by a trench isolation region, further comprising a predetermined circuit including a first and second transistors that require symmetry or relativity characteristics, wherein the distances between a gate electrode and one end of the active region on a source side viewed from the gate electrode in the first and second transistor are substantially same, and the distances between a gate electrode and one end of the active region on a drain side viewed from the gate electrode in the first and second transistor are substantially same.

In the first aspect of the present invention, it is preferable that the predetermined circuit further comprises either a current mirror circuit that has a transistor pair of which gate is commonly connected, or a differential circuit that has a transistor pair of which sources are commonly connected, one of which gates an input signal is supplied to, one of which drains an output signal is generated in.

In the first aspect of the present invention, it is preferable that the predetermined circuit further comprises either a differential amplification circuit which has a current mirror circuit and a differential circuit, or a digital analog conversion circuit further which has a plurality of sets of the current mirror circuit and the differential circuit, of which gate the digital signal is supplied to.

In the first aspect of the present invention, it is preferable that the first and second transistors are formed in a first and second active regions enclosed by a trench isolation region respectively, at least the first and second gate electrodes that are in parallel are formed in each active region, the distance from the first end of the active region to the first gate electrode and the distance from the second end, at the opposite side of the first end, of the active region to the second gate electrode are substantially the same, and the first or second transistor is constructed by combining the first and second gate electrodes in the respective active region.

According to the first aspect of the present invention, the transistor characteristics, such as the drain-source current and the threshold voltage, of the first and second transistors can be made relatively equal, even if the transistor size is very small.

DESCRIPTION OF THE PREFERRED EMBODIMENTS

Figure 1A:
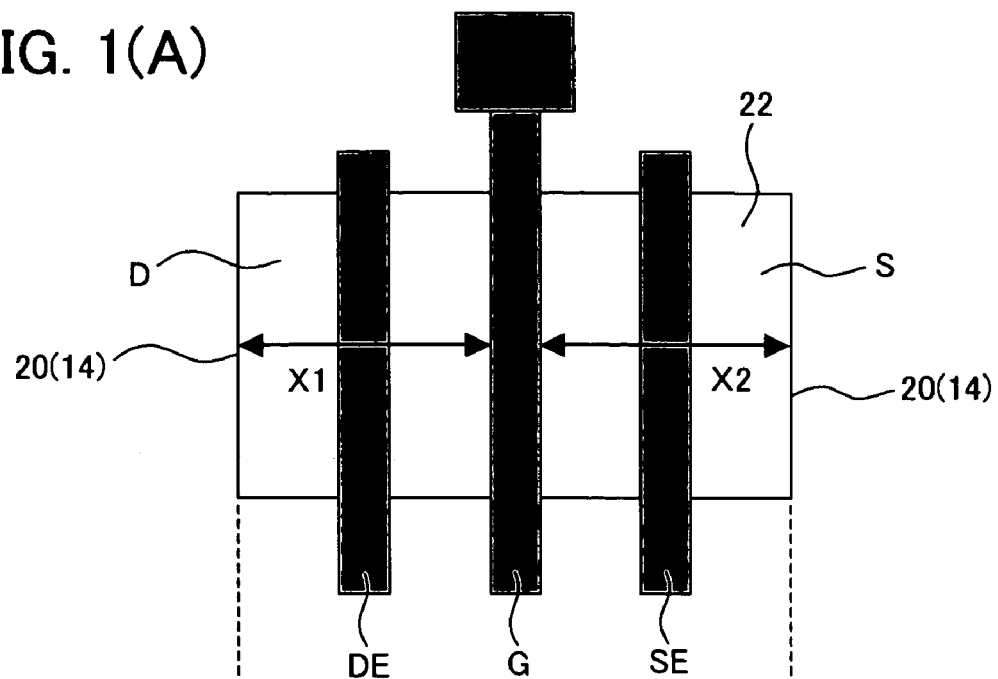
FIG. 1 is a diagram depicting a configuration of an MOS transistor isolated by STI.
Figure 1B:
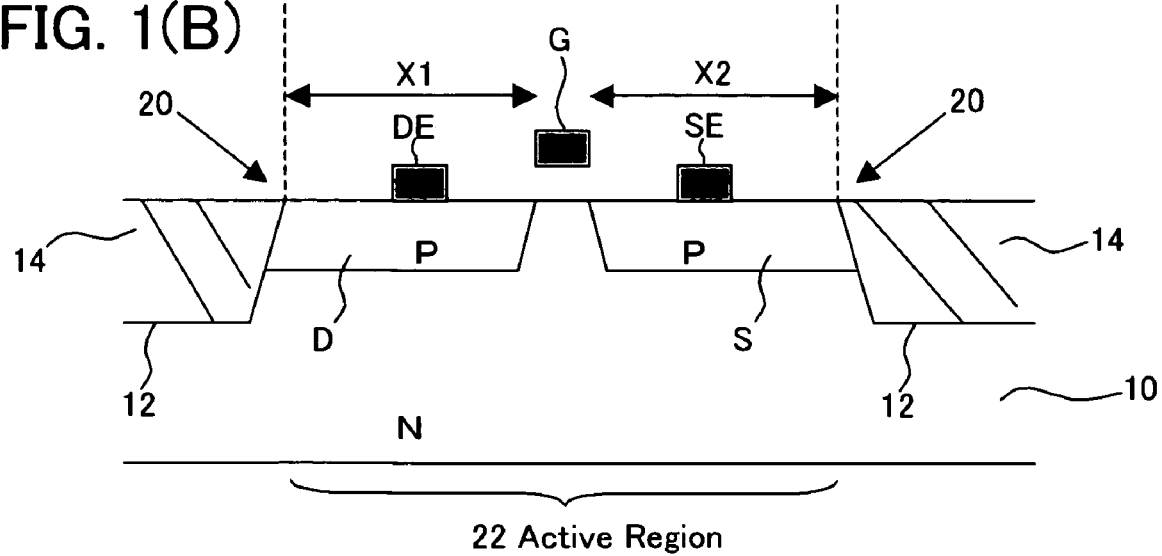

FIG. 1 is a diagram depicting a configuration of an MOS transistor isolated by STI. FIG. 1(A) is a plan view and FIG.

1(B) is a cross-sectional view thereof. As the cross-sectional view shows, the trench 12 is formed on the surface of the silicon semiconductor substrate 10, and STI is formed by filling silicon oxide film 14 in the trench 12. In this active area 22 surrounded by STI, the MOS transistor is formed. In other words, the source region S and the drain region D are formed on the surface of the silicon semiconductor substrate 10, and a gate electrode G is formed on the channel formation region between the source and the drain regions with the gate insulation film between. And in the source region S and the drain region D, the source electrode SE and the drain electrode DE are formed.

Since the insulation film, such as silicon oxide film, is filled in the trench 12 in the STI structure, mechanical stress due to the difference of the thermal expansion coefficient between the insulation film and the silicon substrate, is generated in the boundary 20 between the trench 12 and the diffusion region of the transistor. This stress influences not only the active region of the transistor, but also the channel formation region immediately under the gate electrode, when the transistor size decreases and the distances X1 and X2 from the boundary 20 to the gate electrode G decrease. In the present description, these distances X1 and X2 are called the widths of the source region and the drain region (SD widths).

Figure 2A:
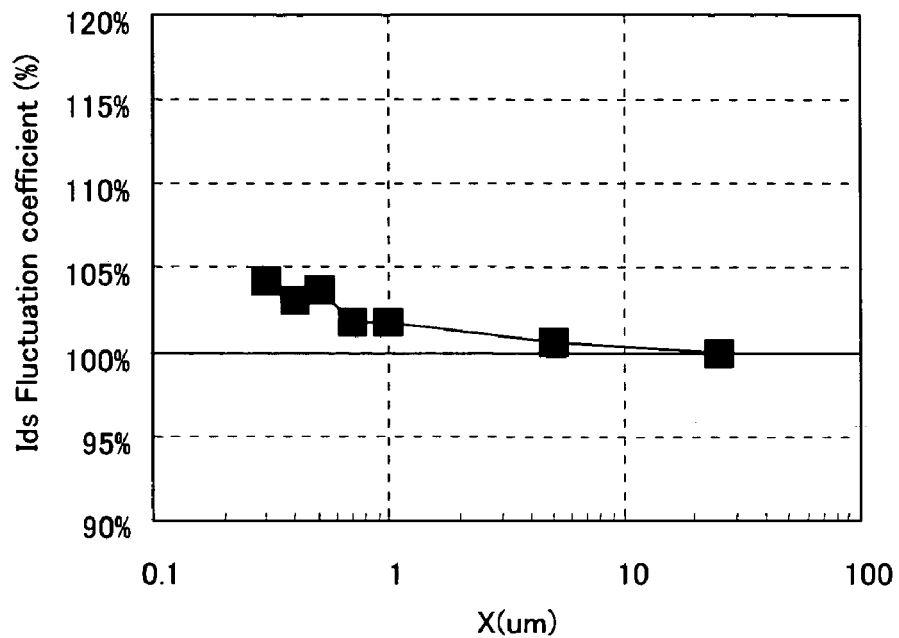
FIG. 2 are graphs showing the characteristics of the source-drain current Ids with respect to the SD width X between the gate electrode and the boundary discovered by the present inventor.
Figure 2B:
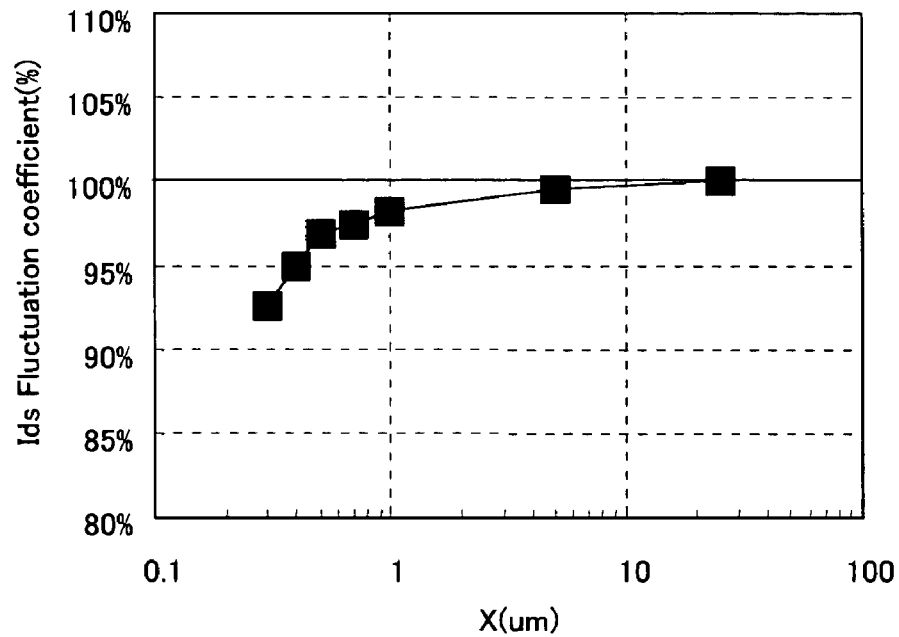

FIG. 2 are graphs which show the characteristics of the current Ids between the source and the drain with respect to the SD width X between the gate electrode and the boundary, discovered by the present inventor. FIG. 2(A) is a characteristics diagram of the P-channel MOS transistor, and FIG. 2(B) is a characteristics diagram of the N-channel MOS transistor, where the abscissa is the SD width (μm) and the ordinate is the Ids fluctuation coefficient when the Ids, when the SD width is sufficiently long, is 100%. The PMOS transistor has a characteristic where the source-drain current Ids increases as the SD width decreases, and the NMOS transistor has a characteristic where the source-drain current Ids decreases as the SD width decreases. The reason why the source-drain current increases or decreases, depending on the conduction type of the channel, is uncertain, but the current characteristics, depending on the SD width, were still discovered when the SD width was decreased by decreasing the transistor size. This fluctuation of the current characteristics means the fluctuation of the threshold voltage.

If a transistor pair of a current mirror circuit or a differential circuit is constructed using small sized transistors with such characteristics, not only the dispersion of the channel width and the channel length, but also the dispersion of the SD width causes a dispersion of the transistor characteristics, which is not preferable. Also depending on the layout configuration of the transistor pair, the SD width of respective transistors may differ. In such a case, the characteristics of the transistor become different, which is inappropriate as a transistor pair because symmetry or a relationship with a predetermined ratio is demanded.

Embodiments of the present invention will now be described with reference to the drawings. The technical scope of the present invention, however, is not limited by these embodiments, but extends over the matters stated in the Claims and equivalents thereof.

Figure 3:
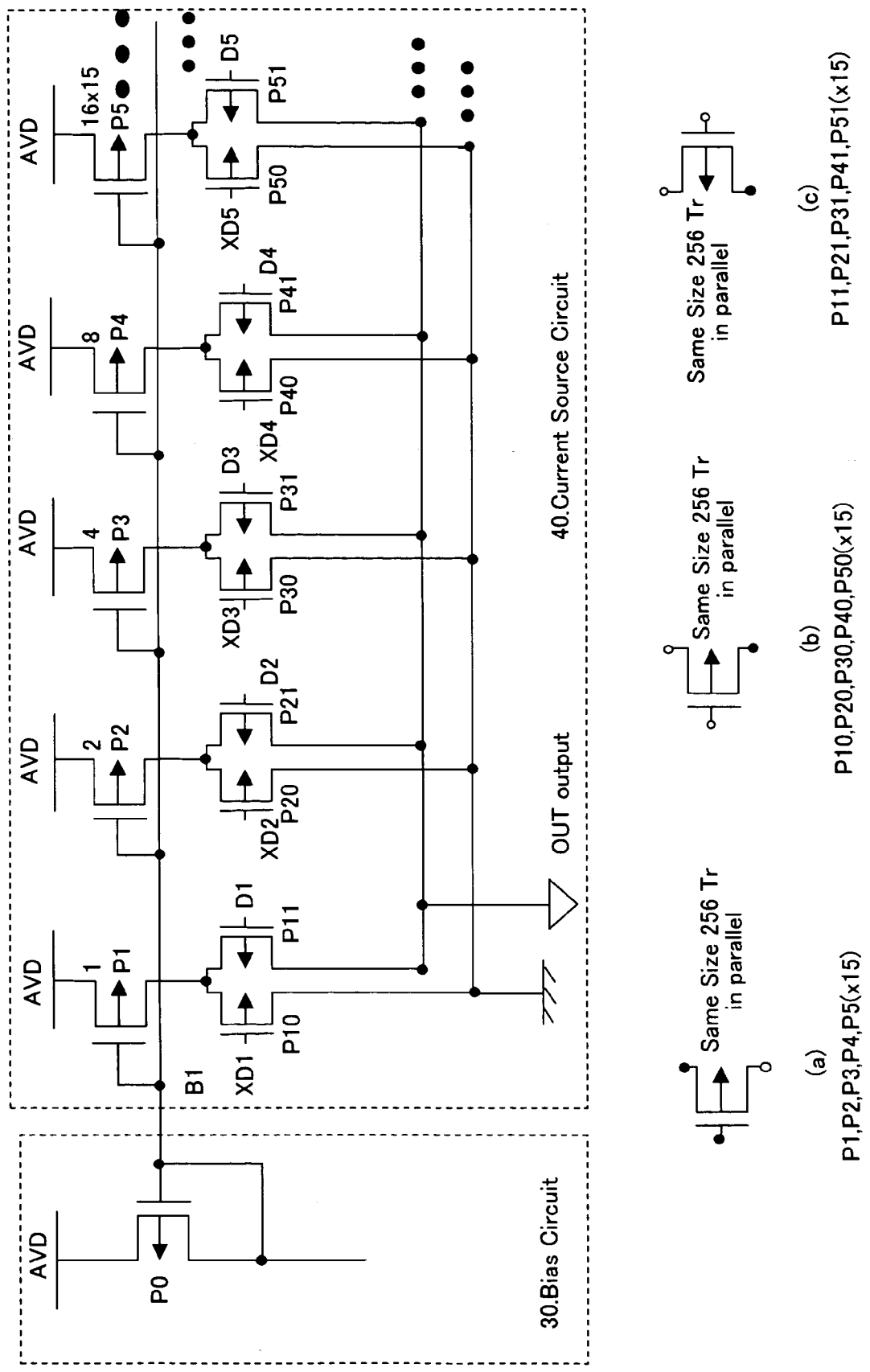
FIG. 3 is a circuit diagram of an 8-bit current type digital/analog converter, as an example of a predetermined circuit to be applied to the present embodiment.

FIG. 3 is a circuit diagram of an 8-bit current type digital/analog converter as an example of a predetermined circuit to be applied to the present embodiment. The digital analog converter (DAC) circuit is comprised of a bias circuit 30 for supplying the bias voltage to a common node B1, and a current source circuit 40 for generating analog current in the output OUT according to the 8-bit digital inputs D1, XD1-D8 and XD8. The P-channel transistor P0 in the bias circuit 30 and the transistors P1-P5 of the current source circuit 40 constitute a current mirror circuit, where the channel widths (gate lengths) of the load transistors P1-P5 are set to be a ratio of the power of 2, such as 1:2:4:8:16. Also 15 transistors P5 with channel width 16 are disposed in parallel, although this is not illustrated. By setting such transistor sizes, the transistors P1-P5 can supply current corresponding to the transistor size.

The current source circuit 40 further comprises a pair of differential transistors P10, P11-P50 and P51 of which gate the digital inputs D1, XD1-D5 and XD5 in a negative phase are supplied respectively to. Although this is not illustrated, 14 more differential transistor pairs P50 and P51 with the transistor size 16 are disposed, and the digital inputs D6 and XD6 are supplied to the gate of the first two pairs (transistor size 32), digital inputs D7 and XD7 are supplied to the gate of the next four pairs (transistor size 64), and digital inputs D8 and XD8 are supplied to the gate of the remaining eight pairs (transistor size 128). The transistor size of these differential transistor pairs are the same size a within differential transistor pair, and the sizes within the differential transistor pairs are sizes matching the channel widths (gate lengths) of the corresponding load transistors P1-P5. By this, current supplied from the load transistors P1-P5 can be directly output to the output OUT.

As mentioned above, the 8-bit current type DAC circuit can generate 256-tone current output for 8-bit digital input. Because of this, 256 units of same sized transistors are used for the load transistors P1-P5 and the differential transistor pairs P10, P11-P50 and P51 respectively, so as to output 256-tone current values at high accuracy, and the number of transistors according to the respective transistor size ratio are connected in parallel. In other words, as FIG. 3 shows, the load transistors P1-P5 (X15) are comprised of 256 transistors (a), the differential transistors P10-P50 (X15) are comprised of 256 transistors (b), and the differential transistors P11-P51 (X15) are comprised of 256 transistors (c) respectively. Therefore three groups of 256 parallel transistors are required.

In the above mentioned differential transistor pairs P10, P11-P50 and P51, the sources thereof are commonly connected, and one transistor to which L-level digital input is supplied is conducted and the other transistor to which H-level digital input is supplied is not conducted. Therefore in each transistor pair, the threshold voltage must be set equal, and current characteristics between a transistor pair must be set with a ratio of the power of 2, just like the load transistors.

As the above description shows, in the current type DAC circuit in FIG. 3, the transistors P0 and P1, and P0 and P2, constituting the current mirror circuit, are transistor pairs which require relative accuracy to be a predetermined current ratio. In the same way, the transistors P10 and P11 and P20 and P21, constituting the differential transistor pair, are transistor pairs which require equal accuracy to be the same current and the same threshold voltage.

Figure 4A:
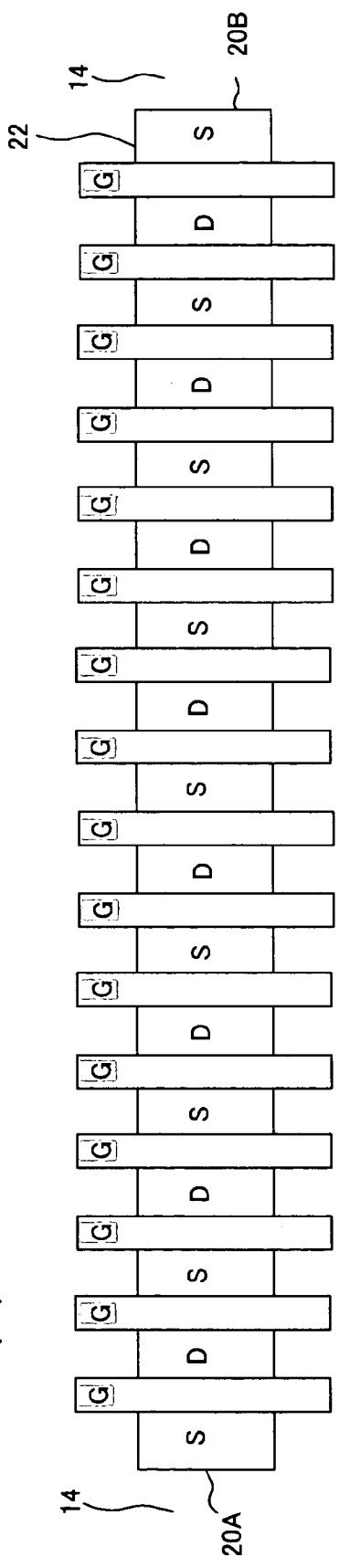
FIG. 4 are diagrams depicting a configuration example of 256 parallel transistors.
Figure 4B:
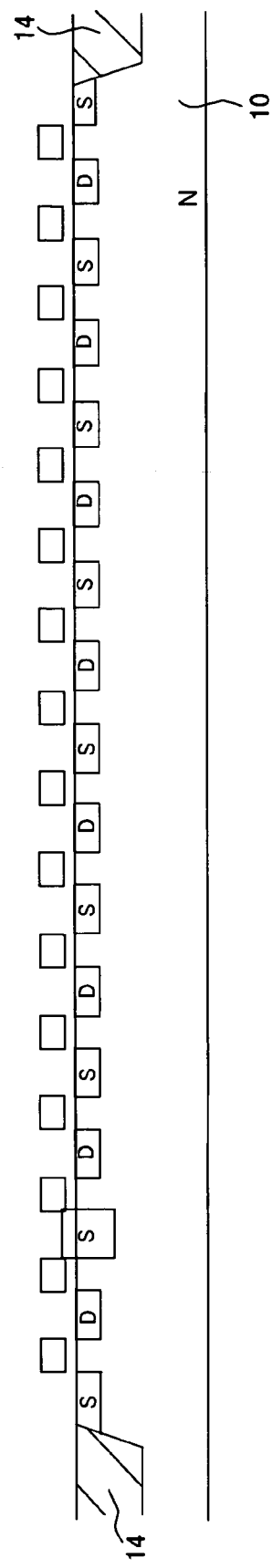

FIG. 4 are diagrams depicting a configuration example of 256 parallel transistors. In the parallel transistors shown in FIG. 4, 16 gate electrodes G are disposed in parallel and 16 transistors are formed in parallel in the active region 22 enclosed by the STI region 14. And an impurity region formed in the active region between the gate electrodes is alternately used as the source region S or the drain region D. By disposing a plurality of gate electrodes in a common active region 22 like this, the area efficiency is increased and transistors can be formed at high density.

However, if such a configuration as parallel transistors is used, the characteristics of the transistors positioned at both ends of the active region 22 and the characteristics of the transistors positioned at the center section of the active region 22 become different as the transistor size decreases. In other words, as FIG. 2 shows, in the transistors positioned at both ends, the distance from both ends 20A and 20B of the active region to the gate electrode G is short, so the drain current increases in the P-channel transistor, and the drain current decreases in the N-channel transistor. On the other hand, in the transistors positioned at the center section, the above mentioned distance is sufficiently long, so the drain current does not fluctuate. As a result, the characteristics of the 16 parallel transistors become the characteristics according to the position in the active region. If this is used for the above mentioned transistors of the current mirror circuit of the DAC circuit or the transistors of the differential transistor pair, the accuracy of the output current value drops, which is inappropriate for a high precision current DAC circuit.

Figure 5:
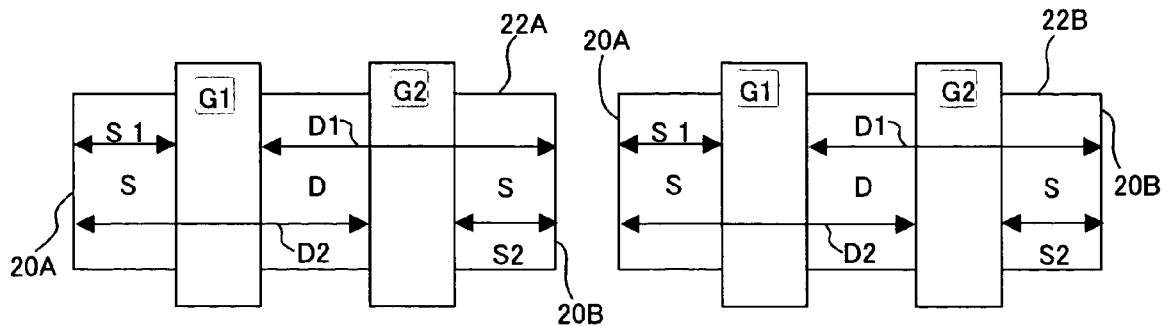
FIG. 5 is a plan view depicting the parallel transistors according to the present embodiment.

FIG. 5 is a plan view depicting a configuration example of parallel transistors according to the present embodiment. In this configuration example of parallel transistors, the parallel transistors are formed in the first and second active regions 22A and 22B enclosed by a trench isolation region respectively. And in each active region, a single gate electrode pair comprised of the first and second gate electrodes G1 and G2 is formed, where the distance S1 from the first end 20A of the active region to the first gate electrode G1, and the distance S2 from the second end 20B, which is at the opposite side of the first end 20A, of the active region to the second gate electrode G2 are substantially the same. The distance D1 from the second end 20B of the active region to the first gate electrode G1 and the distance D2 from the first end 20A to the second gate electrode G2 are also substantially the same. In other words, if the region between the gate electrode pairs G1 and G2 is a drain region, then the distances S1 and S2 at the source side of the transistor pair comprised of the first and second gate electrodes G1 and G2 are the same, and the distances D1 and D2 at the drain side are also the same. In this way, by forming only one pair of gate electrodes in the active region 22, the distance (SD width) between the gate electrode of the transistor and the active region end of each gate electrode can be equalized. S and D in FIG. 5 may be reversed.

As FIG. 5 shows, the active regions 22A and 22B, where a single gate electrode pair is disposed respectively, constitute two transistors respectively, so by forming 128 of the active regions 22A and 22B, 256 parallel transistors can be constructed. And in all the 256 transistors, the distances (SD widths), from one end of the active region to the gate electrode at the source end, are the same, and the distances (SD widths), from one end of the active region to the gate electrode at the drain side, are also the same, so these transistor characteristics do not fluctuate along with miniaturization. Therefore by appropriately combining these parallel transistors, a transistor with a predetermined ratio of current drive capabilities can be provided with high precision. For example, by combining 1, 2, 4, 8 and 16 gate electrodes and using them, the load transistors P1-P5 of the DAC circuit and the transistors P10-P50 in the differential circuit and the transistors P11-P51 in FIG. 3 can be constructed respectively.

The differential transistor pairs P10 and P11 may be constructed by the single active region 22A shown in FIG. 5. In other words, as the transistor size of the differential transistor pairs P10 and P11 is the minimum, the gate electrode G1 and G2 can be used for the transistor P10 and P11 respectively. That is, the differential transistor pair is constructed by the pair of transistors formed in a single active region. In this case as well, the characteristics of the transistors become the same, because the distances S1 and S2 at the source side and the distances D1 and D2 at the drain side are the same for both transistor pairs.

Figure 6:
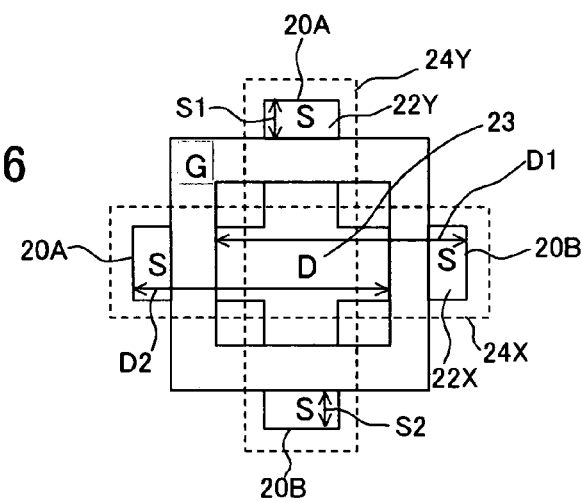
FIG. 6 is a plan view depicting a second configuration example of the parallel transistors according to the present embodiment.

FIG. 6 is a plan view depicting the second configuration example of the parallel transistors according to the present embodiment. In this configuration example of the parallel transistors, the parallel transistors are formed in a plurality of active regions enclosed with trench isolation region respectively. FIG. 6, however, shows only a single active region. This active region is comprised of a first sub-active region 22X which extends in a first direction (X axis direction), as shown in the region 24X indicated by a broken line, and a second sub-active region 22Y which extends in a second direction (Y axis direction of the region 24Y indicated by a broken line), which crosses with the first direction (X axis direction) in the crossing region 23 of the first sub-active region 22X, and the first and second sub-active regions 22X and 22Y form a cross-shape.

And in the first sub-active region 24X, a single gate electrode pair G comprising a first and second gate electrodes is formed between the first end 20A of the first sub-active region 24X and the crossing region 23, and between the second end 20B, at the opposite side of the first end 20A, and the crossing region 23, where the distance D2 from the first end 20A to the first gate electrode and the distance D1 from the second end 20B to the second gate electrode are substantially the same. Also in the second sub-active region 24Y, a single gate electrode pair G comprising the third and fourth electrodes is formed between the first end 20A of the second sub-active region 24Y and the crossing region 23, and between the second end 20B, at the opposite side of the first end 20A, and the crossing region 23, where the distance S1 from the first end 20A to the third gate electrode and the distance S2 from the second end 20B to the fourth gate electrode are substantially the same.

In other words, the configuration example of the parallel transistors in FIG. 6 has a cross-shaped configuration where the two active regions shown in FIG. 5 are crossed, where a total of four transistors can be constructed by the gate electrode pairs disposed in the sub-active regions 22X and 22Y respectively. Therefore a transistor pair can be constructed by using the four gate electrodes formed in a single cross-shaped active region. The size of the transistor pair in this case can have one of the relationships: 1:1, 1:2 and 1:3. In this transistor pair, the crossing region 23 commonly connects the drain or the source. The symbols S and D in FIG. 6 may be reversed.

According to the configuration example of the parallel transistors in FIG. 6, the size of the transistor pair may be 1:4, 1:5, 1:6-1:16 by disposing a plurality of cross-shaped active regions. Also by appropriately combining the gate electrodes, a transistor pair with an arbitrary size ratio can be constructed, and the drain current of the transistors can be accurately set to a relative size since all the SD widths of the transistors to be combined are the same. The configuration example of the DAC circuit with the parallel transistors based on the pattern in FIG. 6 will be described later.

Figure 7A:
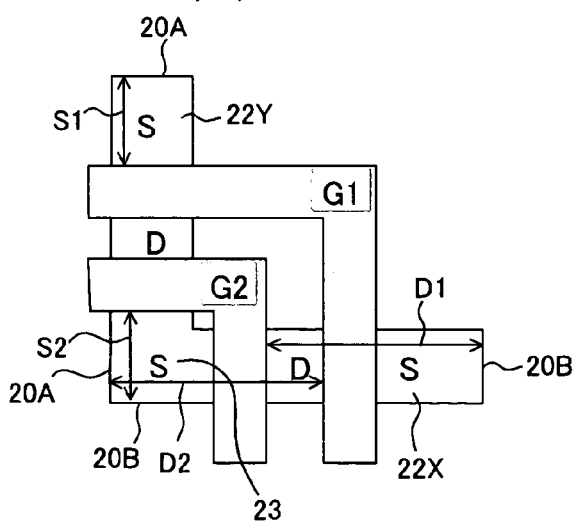
FIG. 7 are plan views depicting a third configuration example of the parallel transistors according to the present embodiment.

FIG. 7 are plan views depicting the third configuration examples of the parallel transistors according to the present embodiment. According to the configuration example of the parallel transistors shown in FIG. 7(A), the first and second transistors are formed in a plurality of active regions enclosed by a trench isolation region respectively. As FIG. 7(A) shows, each active region further comprises a first sub-active region 22X which extends in a first direction (X direction), and a second sub-active region 22Y which extends in a second direction (Y direction) which crosses with the first direction (X direction) in the crossing region 23 of the first sub-active region 22X, where the first and second sub-active regions 22X and 22Y form an L-shape.

In the first sub-active region 22X, a single gate electrode pair G1 and G2 comprised of the first and second gate electrodes are formed in a region of the first sub-active region 22X excluding the crossing region 23, where the distance D2 from the first end 20A to the first gate electrode G1 of the first sub-active region 22X and the distance D1 from the second end 20B, at the opposite side of the first end 20A, to the second gate electrode G2 are substantially the same. In the same way, in the second sub-active region 22Y, a single gate electrode pair G1 and G2 comprised of the third and fourth gate electrodes is formed in a region of the second sub-active region 22Y excluding the crossing region 23, where the distance S1 from the first end 20A of the second sub-active region 22Y to the third gate electrode G1 and the distance from the second end 20B, at the opposite side of the first end 20A, to the fourth gate electrode G2 are substantially the same.

In other words, the active region shown in FIG. 7 (A) has a configuration where the active regions 22 in FIG. 5 are combined to be an L-shape. And by the gate electrode pairs G1 and G2 disposed in the respective sub-active regions 22X and 22Y, a total of four transistors can be constructed. Therefore a transistor pair can be constructed using the four gate electrodes formed in a single L-shaped active region. The size of the transistor pair can have a 1:1, 1:2 or 1:3 relationship. The symbols S and D in FIG. 7 may be reversed.

A plurality of the L-shaped active regions in FIG. 7(A) may be disposed to construct many parallel transistors, so that a transistor pair with an arbitrary ratio of drain current is constructed by appropriately combining these gate electrodes. The configuration example of the DAC circuit in FIG. 3 will be described later.

Figure 7B:
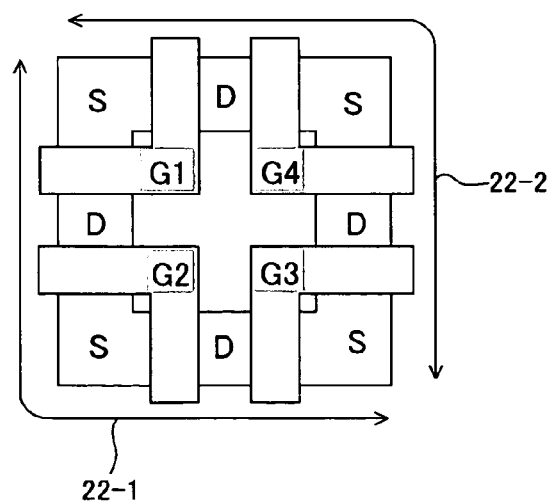

FIG. 7(B) is a configuration example where the two L-shaped active regions in FIG. 7(A) (22-1 and 22-2) are combined to be a rectangle. The configuration of each L-shaped active region 22-1 and 22-2-is the same as that in FIG. 7(A). Therefore if the configuration example in FIG. 7(B) is used, eight transistors can be used using eight gate electrodes.

Figure 8:
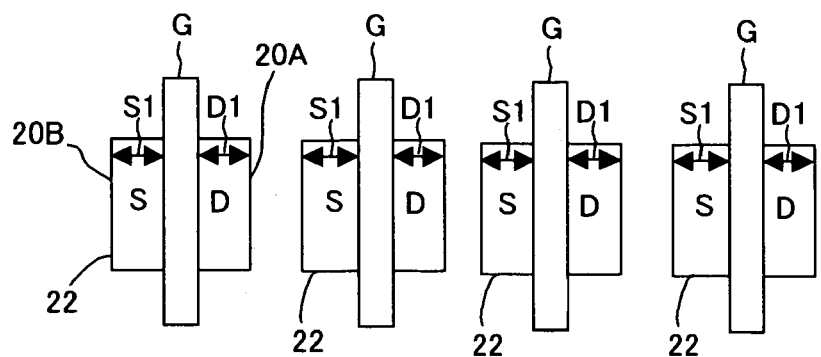
FIG. 8 is a diagram depicting a third configuration example of the parallel transistors.
Figure 9:
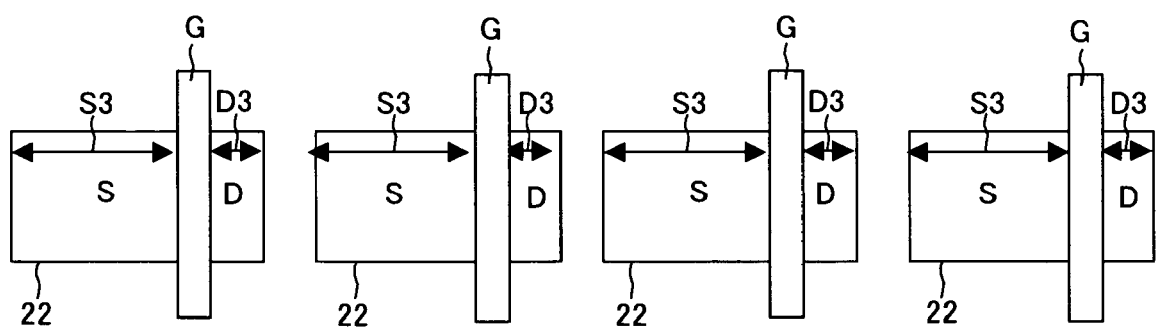
FIG. 9 is a diagram depicting a third configuration example of the parallel transistors.

FIG. 8 and FIG. 9 are diagrams depicting the third configuration example of the parallel transistors. According to this example, a single gate electrode G is disposed in the active region 22 isolated by the STI region respectively, and the distance D1 from the first end 20A to the gate electrode G in the active region 22 is created to be the same for all the active regions, and the distance S1 from the second end 20B, at the opposite side of the first end 20A, to the gate electrode G in the active region 22 is also created to be the same for all the active regions. Therefore the SD widths of all the transistors are all the same. In the example in FIG. 8, the SD widths S1 and D1 at both sides of the gate electrode G have the same distance, but in the example in FIG. 9, the SD width S3 at the source side is longer than the SD width D3 at the drain side. In the example in FIG. 9 as well, the SD width D3 at the drain side of each transistor is the same, and the SD width S3 at the source side is also the same.

Figure 10:
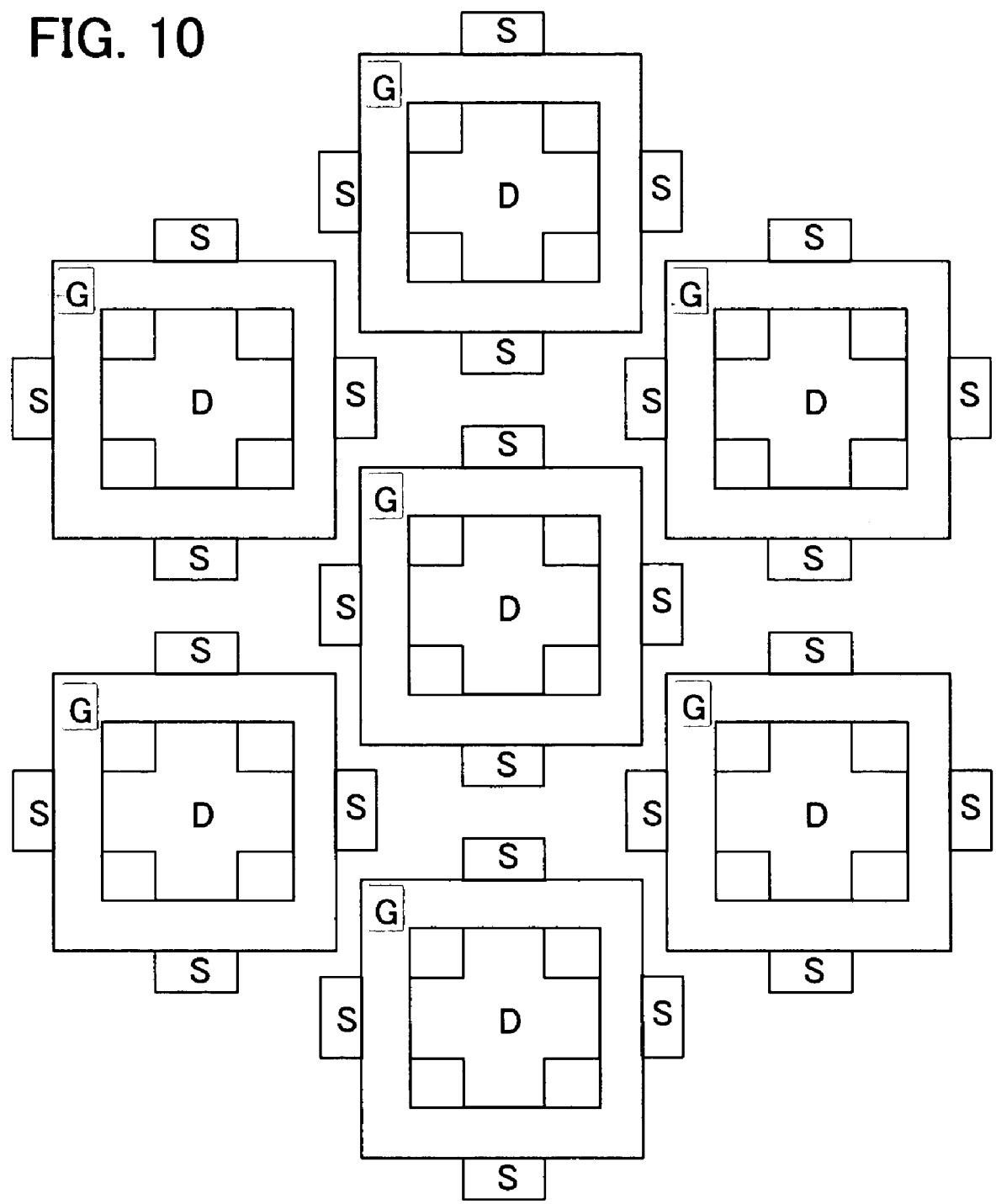
FIG. 10 is a diagram depicting a configuration example of the parallel transistors.

FIG. 10 is a diagram depicting the configuration example of the parallel transistor. This is an example where the cross-shaped active regions shown in FIG. 6 are densely laid out. Since each cross-shaped active region includes four transistors, 4×7=28 parallel transistors are included in the case of the example in FIG. 10. In a typical case, the transistor is constructed in each cross-shaped active region, and one to four gate electrodes are used according to the size of the transistor. In other words, in each active region, the transistor size can be changed from one to four times. If 8 times or 16 times of transistor size is required, two cross-shaped active regions or four cross-shaped active regions may be used.

Figure 11:
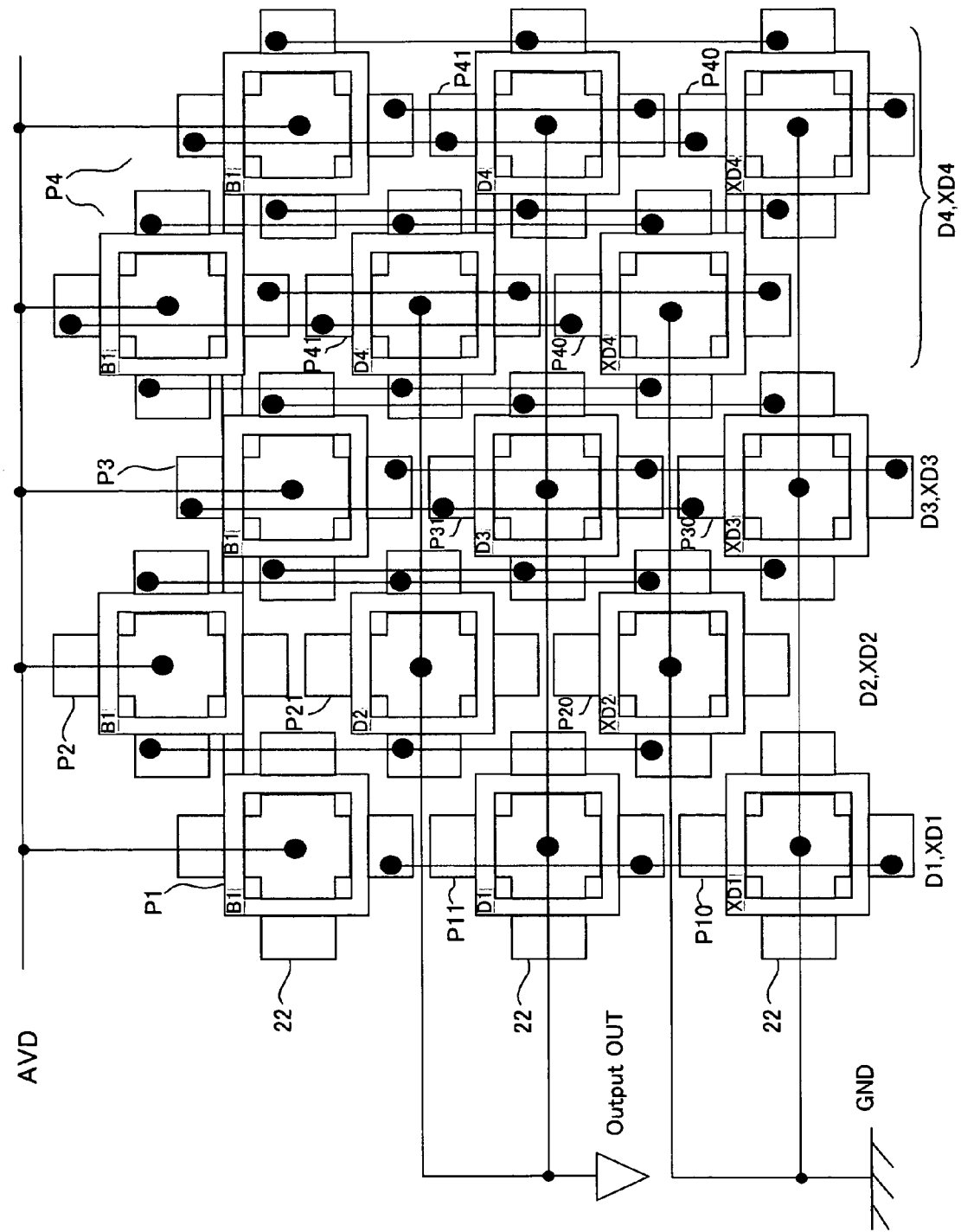
FIG. 11 is a diagram depicting an example where the DAC circuit is constructed using parallel transistors with the cross-shaped active regions.

FIG. 11 is a diagram depicting an example of constructing a DAC circuit using parallel transistors based on cross-shaped active regions. In this configuration example, a part of the current source circuit 40 of the DAC circuit in FIG. 3 is constructed by transistors based on cross-shaped active regions, and in FIG. 11, three cross-shaped active regions are disposed in each row, and a total of five rows are shown. Viewing from the left side of FIG. 11, the first row corresponds to the digital signals D1 and XD1, the second row corresponds to the digital signals D2 and XD2, the third row corresponds to the digital signals D3 and XD3, and the two rows at the far right corresponds to the digital signals D4 and XD4.

The three cross-shaped active regions at the first row from the left are used as a load transistor P1 and the differential transistor pair P11 and P10 respectively. The sizes of these transistors are the minimum, so one transistor comprised of a crossing region and the gate electrode below that in the respective cross-shaped active region is used. Therefore to these gate electrodes, the node B1, and the digital inputs D1 and D2 are connected respectively. The SD widths of these transistors are all the same, so substantially equal threshold voltage characteristics can be provided to the differential transistor pair.

The three cross-shaped active regions at the second row from the left are used as the load transistor P2 and the differential transistor pair P21 and P20 respectively. The sizes of these transistors are twice as large as the minimum, so two transistors comprised of the crossing region and the two gate electrodes at the left and right thereof of the respective cross-shaped active region are used. Therefore to these gate electrodes, the node B1, and the digital inputs D2 and XD2 are connected respectively. Since the SD widths of the two parallel-connected transistors are all the same, the current amount thereof can be accurately set to double the minimum current. And substantially the same threshold voltage characteristics can be provided to the differential transistor pair.

The three cross-shaped active regions at the third row from the left are used as the load transistor P3 and the differential transistor pair P31 and P30 respectively. The sizes of these transistors are four times the minimum size, so four transistors comprised of the crossing region and the four gate electrodes at the left, right, top and bottom thereof of the respective cross-shaped active regions are used. Therefore to these gate electrodes, the node B1 and the digital inputs D3 and XD3 are connected respectively. Since the SD widths of the four parallel-connected transistors are all the same, the current amount thereof can be accurately set to four times the minimum current. And the differential transistors pair has substantially the same threshold value.

The six cross-shaped active regions at the first and second row from the right are used as the load transistor P4 and the differential transistor pair P41 and P40 respectively. The sizes of these transistors are eight times the minimum size, so a total of eight transistors comprised of the crossing regions and the four gate electrodes at the left, right, top and bottom thereof of the two cross-shaped active regions are used respectively. Therefore to these gate electrodes, the node B1 and the digital inputs D4 and XD4 are connected respectively. In this case, the SD widths of the eight parallel-connected transistors are all the same, so the current amount thereof accurately becomes eight times the minimum current. The differential transistor pair has substantially the same threshold voltage.

Although this is not illustrated, when the transistors P5, P50 and P51, of which the transistor size is 16 times the minimum size, are formed, 16 transistors in four rows of the cross-shaped active regions are used respectively. Since the SD widths of the 16 parallel-connected transistors are all the same, the current amount of the transistor can accurately be 16 times the minimum size.

Figure 12:
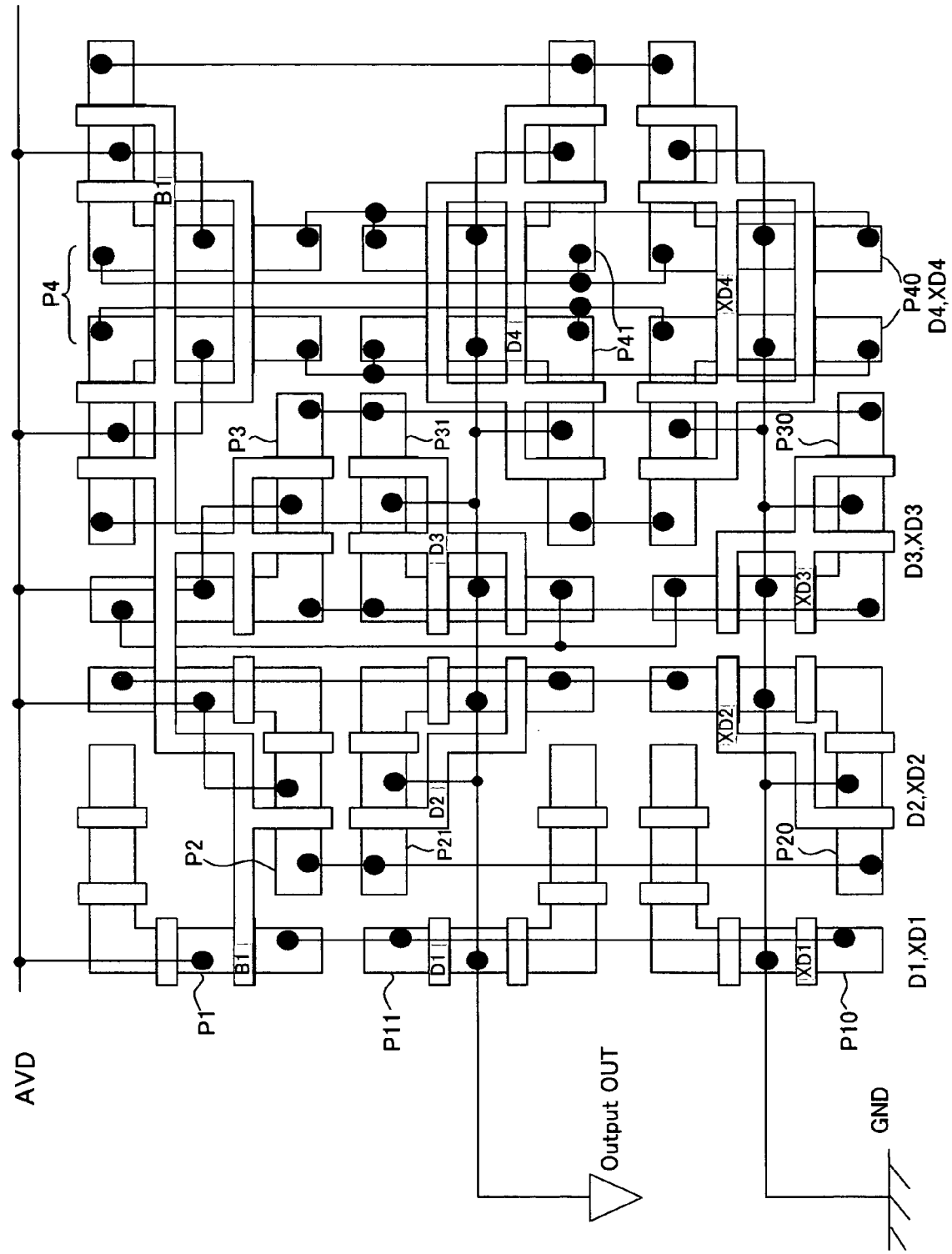
FIG. 12 is a diagram depicting an example where the DAC circuit is constructed using parallel transistors with the L-shaped active regions.

FIG. 12 is a diagram depicting an example where the DAC circuit is constructed using the parallel transistors in the L-shaped active regions. In this configuration example, a part of the current source circuit 40 of the DAC circuit in FIG. 3 is constructed by transistors in the L-shaped active regions, just like FIG. 11. In FIG. 12, three L-shaped active regions are disposed in each row, and a total of five rows are shown. The first row from the left in FIG. 12 corresponds to the digital signals D1 and XD1, the second row corresponds to the digital signals D2 and XD2, the third row corresponds to the digital signals D3 and XD3, and the two rows at the far right correspond to the digital signals D4 and XD4. To increase the layout efficiency, the L-shape is alternately reversed, and the L-shapes of the adjacent rows are reversed so as to face each other. Needless to say layout is not limited to this configuration.

The three L-shapes on the first row from the left constitute the transistors P1, P11 and P10 respectively, and one transistor in the sub-active region in the Y direction of the L-shape is used respectively. Then the three L-shapes on the second row constitute the transistors P2, P21 and P20 respectively, and one transistor each is used from the sub-active region in the Y direction and the sub-active region in the X direction of the L-shape respectively, and two transistors are used from the active region of each L-shape.

The three L-shapes at the third row from the left constitute the transistors P3, P31 and P30 respectively, and all four transistors are used in each L-shape. In other words, the size of each transistor is four times the minimum size. And six L-shapes on the fourth and fifth row from the left constitute the transistors P4, P41 and P40, and each transistor is constructed to be eight times as large as the minimum. Because of this, the two L-shaped gate electrodes B1, D4 and XD4 are integrated respectively.

In this example as well, the SD width of each minimum sized transistor formed in the L-shaped active region is all the same, so the current amount of the transistors formed by connecting in parallel these minimum-size transistors is accurately in proportion to the number of transistors. Even if the size is very small, the threshold voltage thereof can be substantially the same. Therefore 256-tone analog output current amount of the DAC circuit can be accurately generated.

Figure 13A:
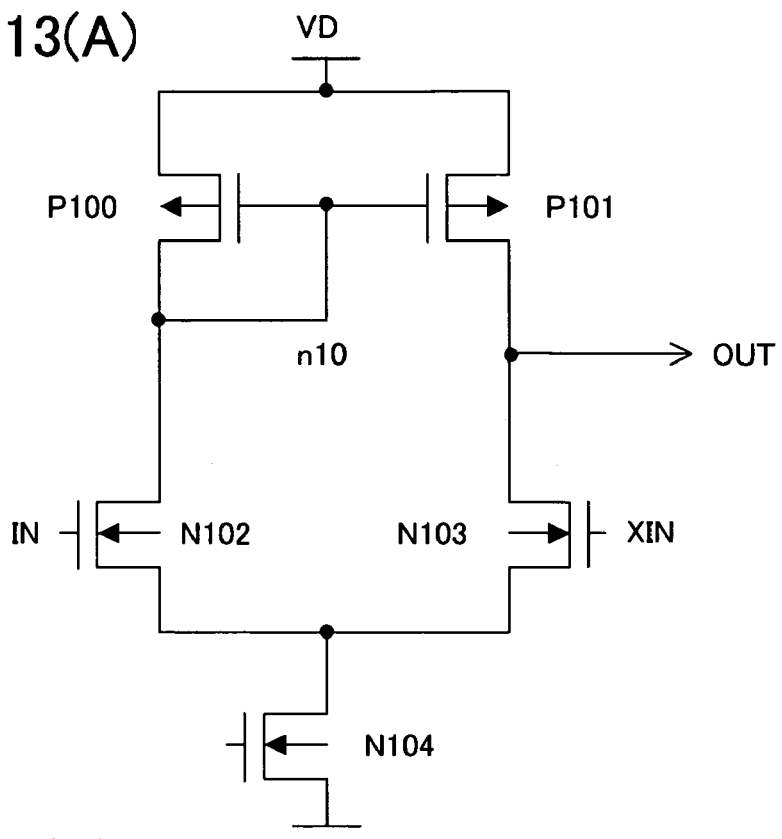
FIG. 13 is a circuit diagram of the differential amplification circuit and a diagram depicting a layout example thereof.

FIG. 13 is a circuit diagram of the differential amplification circuit and diagram of the layout example thereof. FIG. 13(A) is a circuit diagram of the differential amplification circuit. The differential amplification circuit is comprised of a pair of P-channel transistors P100 and P101 which constitute the current mirror circuit, N-channel transistors N102 and N103 which constitute the differential transistor pair whose sources are commonly connected, and N-channel transistor N104 which constitutes the current source transistor. To the gates of the differential transistor pairs N102 and N103, the differential input signals IN and XIN are supplied, and the output signal OUT is output from the drain terminal of the transistor N103. It is preferable that the transistor pair of the current mirror circuit is set to a predetermined current ratio, and the differential transistor pair is set to the same threshold voltage.

Figure 13B:
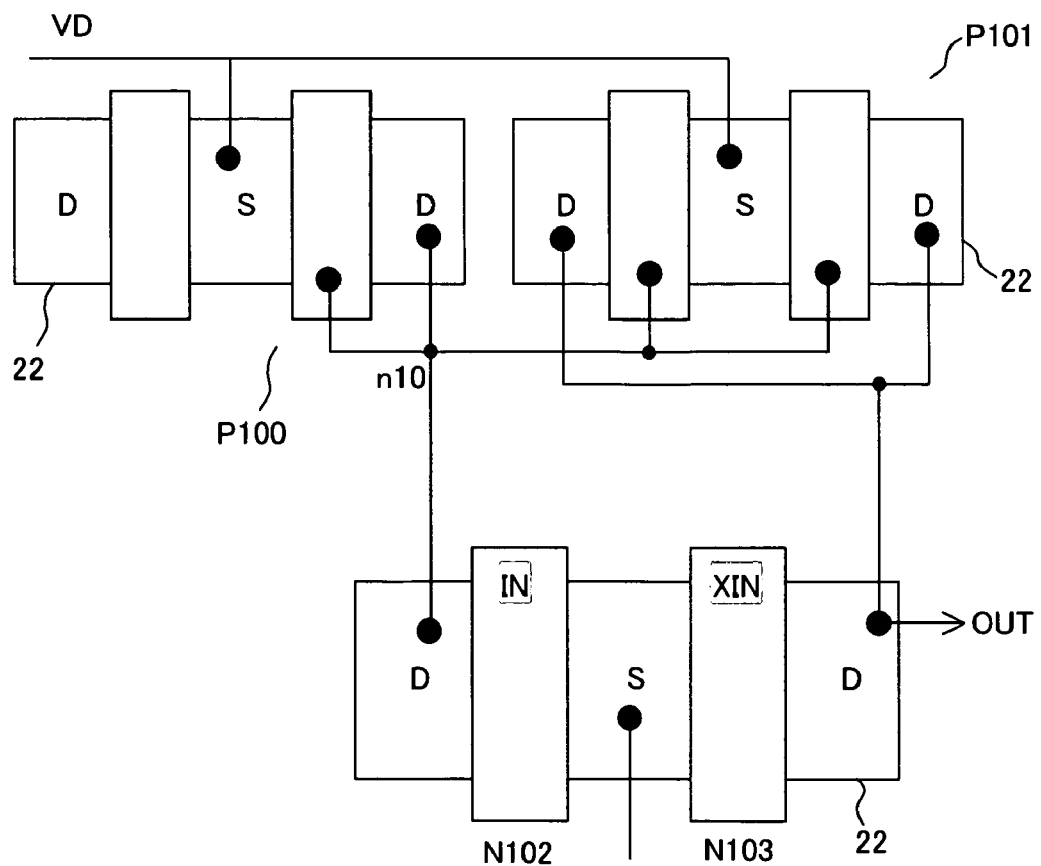

FIG. 13(B) is a layout example of the current mirror circuit and the differential transistor pair of the differential amplification circuit. In this layout example, the transistor sizes of the transistor pair P100 and P101 of the current mirror circuit is 1:2. Three active regions 22 having one pair of gate electrodes shown in FIG. 5 are disposed. The transistor P100 is constructed using one gate electrode in the active region 22, and the transistor P101 is constructed by connecting in parallel two gate electrodes in the active regions 22. The differential transistor pair N102 and N103, on the other hand, is constructed using the two gate electrodes formed in the common active region 22. In other words, the differential transistor pair N102 and N103 is constructed in a single active region.

By this configuration, the current ratio of the transistor pair P100 and P101 of the current mirror circuit can be accurately set to 1:2, and the current ratio of the differential transistor pair N102 and N103 can be accurately set to 1:1.

Figure 14A:
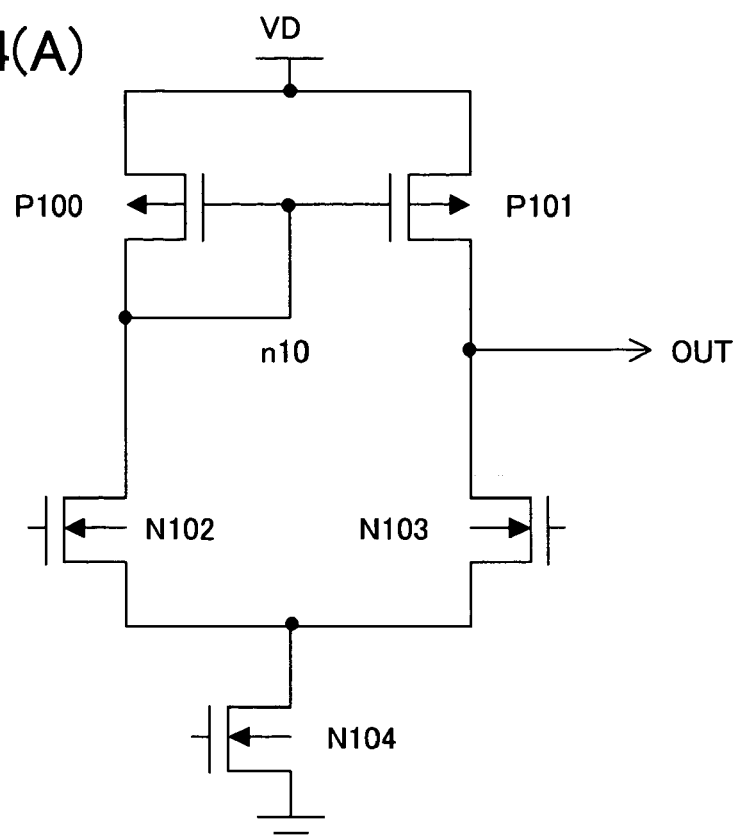
FIG. 14 is a circuit diagram of the differential amplification circuit and a diagram depicting another layout example thereof.
Figure 14B:
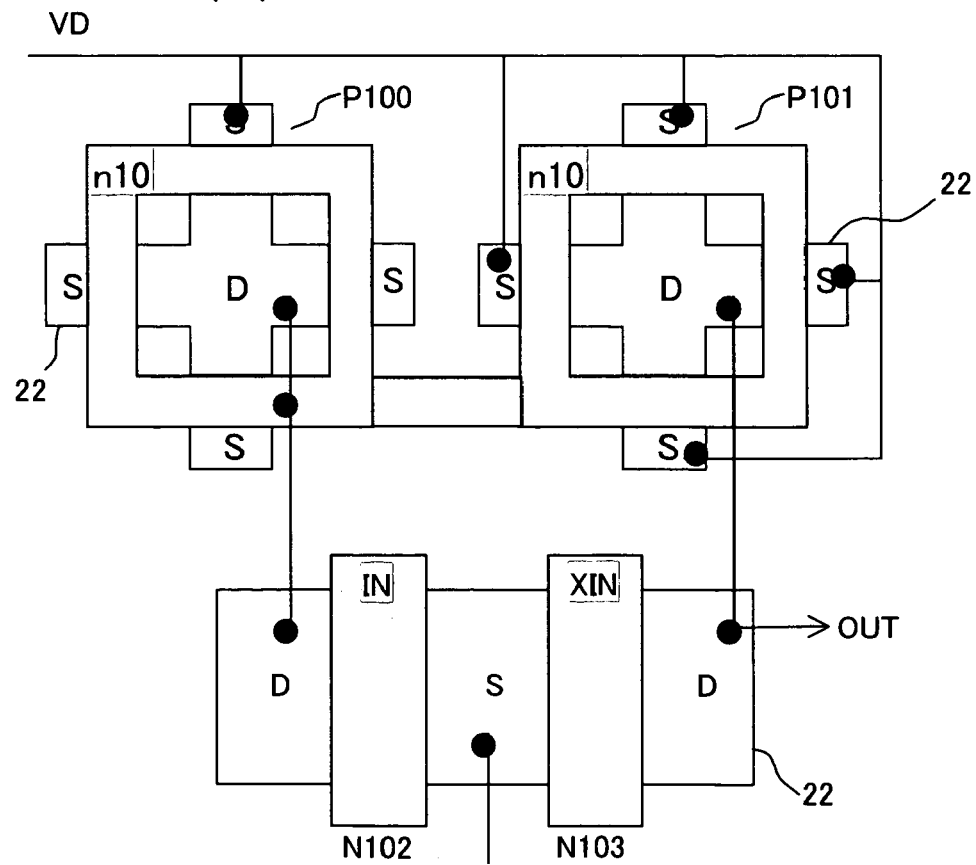

FIG. 14 is a circuit diagram of the differential amplification circuit and diagram of another layout example thereof. FIG. 14(A) is a circuit diagram of the same differential amplification circuit as in FIG. 13(A). FIG. 14(B) is another layout example of the current mirror circuit and the differential transistor pair of the differential amplification circuit. In this layout example, two cross-shaped active regions 22 shown in FIG. 6 are formed so that the current ratio of the transistor pair P100 and P101 of the current mirror circuit is set to 1:4. And in the active region 22 at the left, the transistor P100 is constructed with one transistor, and in the active region 22 at the right, the transistor P101 is constructed with four transistors. The configuration of the differential transistor pair N102 and N103 is the same as in FIG. 13.

According to the above described embodiments, a cross-shaped or L-shaped layout, isolated by STI where an active region having a single gate electrode pair respectively, are combined, are closely disposed, and the number corresponding to the transistor size, of the transistors with these gate electrodes are connected in parallel. The gate electrode pair of each active region is constructed so that the respective SD widths are the same. Therefore the transistor pair which is constructed by connecting an arbitrary number of transistors in parallel can have high precision current characteristics corresponding to the number of units. As FIG. 8 and FIG. 9 show, the same functional effect can be obtained by laying out an arbitrary number of many transistors with a single gate electrode in the active region is disposed, and connecting them in parallel. And by using the patterns in FIG. 5, FIG. 6 and FIG. 7, the area efficiency can be further increased.

What is claimed is:

1. A semiconductor device comprising:
   transistors formed in an active region isolated by a trench isolation region; and
   a predetermined circuit including first and second transistors that have symmetry or relative characteristics,
   wherein distances between a gate electrode and an end of said active region on a source side in said first and second transistors are substantially same, and distances between a gate electrode and an end of said active region on a drain side in said first and second transistors are substantially same, and
   wherein said same distances on said drain sides and said same distances on said source sides are of different length.

2. The semiconductor device according to claim 1, wherein said predetermined circuit includes either a current mirror circuit having a transistor pair of which gates are commonly connected, or a differential circuit having a transistor pair of which sources are commonly connected, one of which gates an input signal is supplied to, and one of which drains an output signal is output to.

3. The semiconductor device according to claim 2, wherein
said predetermined circuit further comprises either a differential amplification circuit having said current mirror circuit and said differential circuit, or a digital analog conversion circuit having a plurality of sets of said current mirror circuit and said differential circuit of which gates a digital signal is supplied to.

4. The semiconductor device according to any of claims 1 to 3, wherein
said first and second transistors are respectively formed in first and second active regions surrounded respectively by the trench isolation region,
single gate electrodes are formed in said first and second active regions respectively, said distances on the source side in said first and second transistors are formed to be substantially the same, said distances on the drain side in said first and second transistors are formed to be substantially the same.

5. The semiconductor device according to any of claims 1 to 3, wherein
said first and second transistors are formed in a common active region surrounded by the trench isolation region,
a single gate electrode pair including first and second gate electrodes is formed in said common active region, where the distance from a first end of said active region to said first gate electrode and the distance from a second end, at the opposite side of said first end, of said active region to said second gate electrode are substantially the same, and a region between said first and second gate electrodes of said active region is a common source or drain region of said first and second transistors.

6. The semiconductor device according to any of claim 1 to claim 3, wherein
said first and second transistors are formed in a plurality of active regions surrounded respectively by the a trench isolation region,
a single gate electrode pair including first and second gate electrodes is formed in each active region, the distance from a first end of said active region to said first gate electrode and the distance from a second end, at the opposite side of said first end, of said active region to said second gate electrode are substantially the same, and
said first or second transistor is constructed by combining said first and second gate electrodes.

7. The semiconductor device according to any of claims 1 to 3, wherein
said first and second transistors are formed in a plurality of active regions surrounded respectively by the trench isolation region,
each active region includes a first sub-active region that extends in a first direction, and a second sub-active region that extends in a second direction that crosses with said first direction in a crossing region of said first sub-active region, and forms a cross-shape with said first and second sub-active regions,
in said first sub-active region, a single gate electrode pair including first and second gate electrodes is formed between a first end of said first sub-active region and said crossing region, and between a second end, at the opposite side of said first end, and said crossing region, and the distance from said first end to said first gate electrode and the distance from said second end to said second gate electrode are substantially the same,
in said second sub-active region, a single gate electrode pair including third and fourth gate electrodes is formed between a first end of said second sub-active region and said crossing region, and between a second end, at the opposite side of said first end, and said crossing region, and the distance from said first end to said third gate electrode and the distance from said second end to said fourth gate electrode are substantially the same, and
said first or second transistor is constructed by combining said first to fourth gate electrodes as an only open-squared gate structure of said transistors.

8. The semiconductor device according to any of claims 1 to 3, wherein
said first and second transistors are formed in a plurality of active regions surrounded respectively by the trench isolation region,
each active region includes a first sub-active region that extends in a first direction, and a second sub-active region that extends in a second direction that crosses with said first direction in a crossing region of said first sub-active region, and forms an L-shape with said first and second sub-active regions,
in said first sub-active region, a single gate electrode pair including first and second gate electrodes is formed in said first sub-active region excluding said crossing region of said first sub-active region, and the distance from a first end of said first sub-active region to said first gate electrode, and the distance from a second end, at the opposite side of said first end, to said second gate electrode are substantially the same,
in said second sub-active region, a single gate electrode pair including third and fourth gate electrodes is formed in said second sub-active region excluding said crossing region of said second sub-active region, and the distance from a first end of said second sub-active region to said third gate electrode and the distance from a second end, at the opposite side of said first end, to said fourth gate electrode are substantially the same, and
said first or second transistor is constructed by combining said first to fourth gate electrodes.

9. The semiconductor device according to claim 8, wherein said first or second active region has a pair of L-shapes that is constructed by said first and second sub-active regions, and said pair of L-shapes forms a rectangular shape.

10. The semiconductor device according to claim 7, wherein a plurality of gate electrodes in said first or second active region is constructed by common electrodes respectively.

11. The semiconductor device according to claim 7, wherein said first and second transistors included in said current mirror circuit use a different number of first to fourth gate electrodes.

12. The semiconductor device according to claim 1, wherein
said first and second transistors are formed in a plurality of active regions surrounded respectively by the trench isolation region,
each active region includes a first sub-active region that extends in a first direction, and a second sub-active region that extends in a second direction that crosses with said first direction in a crossing region of said first sub-active region, and forms an L-shape with said first and second sub-active regions,
in said first sub-active region, a single gate electrode pair including first and second gate electrodes is formed in said first sub-active region excluding said crossing region of said first sub-active region, and the distance from a first end of said first sub-active region to said first gate electrode, and the distance from a second end, at the opposite side of said first end, to said second gate electrode are substantially the same, in said second sub-active region, a single gate electrode pair including third and fourth gate electrodes is formed in said second sub-active region excluding said crossing region of said second sub-active region, and the distance from a first end of said second sub-active region to said third gate electrode and the distance from a second end, at the opposite side of said first end, to said fourth gate electrode are substantially the same, and said first and third gate electrodes intersect to form an L-shape, and said second and fourth gate electrodes intersect to form a second L-shape.

* * * * *